US012615445B2

(12) United States Patent
Kim et al.

(10) Patent No.: US 12,615,445 B2
(45) Date of Patent: Apr. 28, 2026

(54) IMAGE SENSING DEVICE INCLUDING DIFFERENT TYPES OF SUB-PIXELS AND IMAGING DEVICE INCLUDING THE SAME

(71) Applicant: SK hynix Inc., Icheon-si (KR)

(72) Inventors: Han Jun Kim, Icheon-si (KR); Seong Lae Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 215 days.

(21) Appl. No.: 18/511,772

(22) Filed: Nov. 16, 2023

(65) Prior Publication Data

US 2024/0214699 A1    Jun. 27, 2024

(30) Foreign Application Priority Data

Dec. 26, 2022    (KR) ........................ 10-2022-0184486

(51) Int. Cl.
*H04N 25/13*    (2023.01)
*H10F 39/00*    (2025.01)
*H10F 39/18*    (2025.01)

(52) U.S. Cl.
CPC ......... *H04N 25/134* (2023.01); *H10F 39/182* (2025.01); *H10F 39/8057* (2025.01)

(58) Field of Classification Search
CPC .... H04N 25/134; H04N 25/133; H04N 25/77; H04N 25/779; H04N 25/78; H10F 39/182; H10F 39/8057; H10F 39/8053; H10F 39/8063; H10F 39/807; H10F 39/8023; H10F 39/8037
See application file for complete search history.

(56) References Cited

U.S. PATENT DOCUMENTS

| | | | |
|---|---|---|---|
| 7,414,630 B2 | 8/2008 | Schweng et al. | |
| 9,324,262 B2 * | 4/2016 | Kim ...................... | G09G 3/3233 |
| 2018/0269245 A1 * | 9/2018 | Mlinar ................... | H04N 23/11 |
| 2019/0378864 A1 * | 12/2019 | Innocent ............. | H04N 25/532 |
| 2020/0020730 A1 * | 1/2020 | Mlinar ................ | H04N 25/706 |
| 2021/0233947 A1 | 7/2021 | Zang et al. | |

* cited by examiner

*Primary Examiner* — Gevell V Selby
(74) *Attorney, Agent, or Firm* — Perkins Coie LLP

(57) ABSTRACT

An image sensing device includes a plurality of pixels, each pixel configured to respond to incident light to produce photocharges corresponding to the incident light and include a first sub-pixel and a second sub-pixel surrounding the first sub-pixel. The first sub-pixel is one of a color sub-pixel configured to selectively sense first color light within the incident light and a white sub-pixel configured to sense the incident light at different colors; and the second sub-pixel is the other of the color sub-pixel and the white sub-pixel.

17 Claims, 9 Drawing Sheets

300

200

300

600

700

IMAGE SENSING DEVICE INCLUDING DIFFERENT TYPES OF SUB-PIXELS AND IMAGING DEVICE INCLUDING THE SAME

CROSS-REFERENCE TO RELATED APPLICATION

This patent document claims the priority and benefits of Korean patent application No. 10-2022-0184486, filed on Dec. 26, 2022, the disclosure of which is incorporated herein by reference in its entirety as part of the disclosure of this patent document.

TECHNICAL FIELD

The technology and implementations disclosed in this patent document generally relate to an image sensing device capable of generating image data by sensing light, and an imaging device including the same.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device including pixels, each of which includes different types of sub-pixels and an imaging device including the same.

In accordance with an embodiment of the disclosed technology, an image sensing device may include a plurality of pixels, each of which includes a first sub-pixel and a second sub-pixel surrounding the first sub-pixel. The first sub-pixel is one of a color sub-pixel configured to selectively sense first color light within the incident light and a white sub-pixel configured to sense the incident light at different colors; and the second sub-pixel is the other of the color sub-pixel and the white sub-pixel.

In accordance with another embodiment of the disclosed technology, an image sensing device comprising a plurality of pixels, each pixel configured to respond to incident light to produce photocharges corresponding to the incident light and include a first sub-pixel and a second sub-pixel surrounding the first sub-pixel, wherein the first sub-pixel is one of a color sub-pixel configured to selectively sense first color light within the incident light and a white sub-pixel configured to sense the incident light at different colors; and the second sub-pixel is the other of the color sub-pixel and the white sub-pixel; and an image signal processor communicatively coupled to the plurality of pixels and configured to process image data generated from each of the first sub-pixel and the second sub-pixel.

In accordance with another embodiment of the disclosed technology, an imaging device may include: a pixel array including pixels that are arranged in rows and columns, wherein each pixel includes a first sub-pixel including a first photoelectric conversion element disposed in a substrate and configured to produce an electrical signal in response to first light incident to the first photoelectric conversion element; and a second sub-pixel including a second photoelectric conversion element disposed in the substrate and configured to produce a second electrical signal in response to second light incident to the second photoelectric conversion element, wherein one of the first sub-pixel and the second sub-pixel is a white sub-pixel configured to transmit incident light to a corresponding photoelectric conversion element without optically filtering the incident light.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
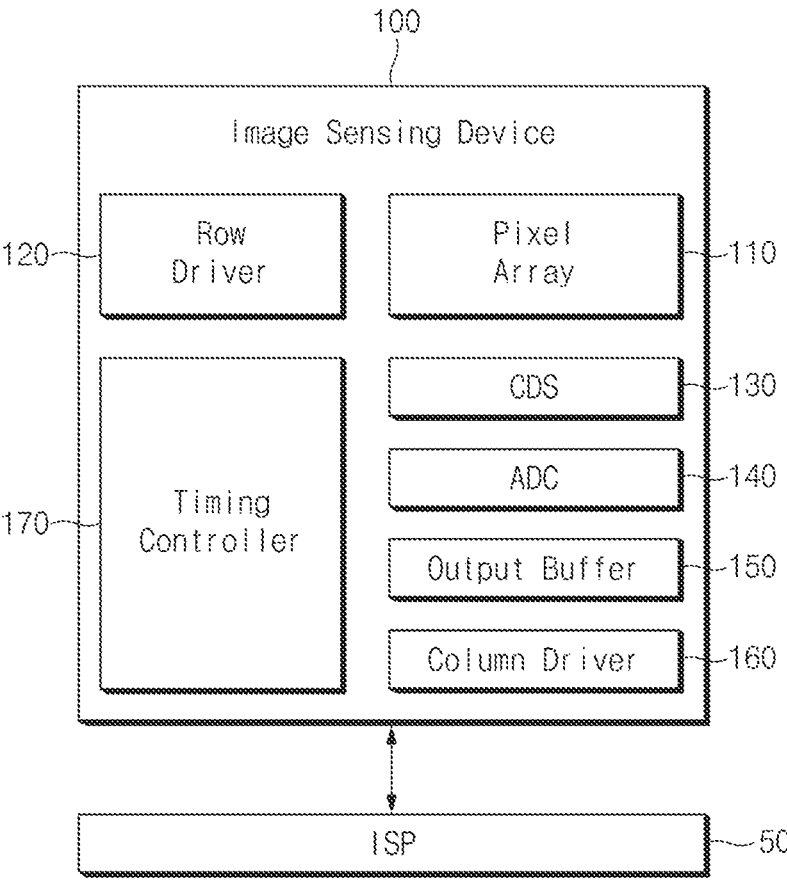
FIG. 1 is a block diagram illustrating an example of an imaging device based on some implementations of the disclosed technology.

This patent document provides implementations and examples of an image sensing device capable of generating image data by sensing light and an imaging device including the same that may be used in configurations to substantially address one or more technical or engineering issues and to mitigate limitations or disadvantages encountered in some other image sensing devices. Some implementations of the disclosed technology relate to an image sensing device including pixels, each of which includes different types of sub-pixels and an imaging device including the same. The disclosed technology provides various implementations of an image sensing device which include a color sub-pixel and a white sub-pixel in one pixel so that color information and brightness information for each pixel can be obtained together, thereby providing a higher quality of images.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

FIG. 1 is a block diagram illustrating an example of an imaging device based on some implementations of the disclosed technology.

The imaging device may include an image sensing device 100 and an image signal processor (ISP) 50.

Referring to FIG. 1, the image sensing device 100 may include a pixel array 110, a row driver 120, a correlated double sampler (CDS) 130, an analog-digital converter (ADC) 140, an output buffer 150, a column driver 160 and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of imaging pixels arranged in rows and columns. In one example, the plurality of imaging pixels can be arranged in a two-dimensional pixel array including rows and columns. In another example, the plurality of imaging pixels can be arranged in a three-dimensional pixel array. The plurality of imaging pixels may convert an optical signal into an electrical signal on a unit pixel basis or a pixel group basis, where the imaging pixels in a pixel group share at least certain internal circuitry. The pixel array 110 may receive pixel control signals, including a row selection signal, a pixel reset signal and a transfer signal, from the row driver 120. Upon receiving the pixel control signals, corresponding imaging pixels in the pixel array 110 may be activated to perform the operations corresponding to the row selection signal, the pixel reset signal, and the transfer signal. Each of the imaging pixels may generate photocharges corresponding to the intensity (or illuminance) of incident light, may generate an electrical signal corresponding to the amount of photocharges, thereby sensing the incident light. For convenience of description, the imaging pixel may also be referred to as a pixel.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row driver 120 may sequentially enable the pixel reset signal for resetting imaging pixels corresponding to at least one selected row, and the transfer signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node. The reference signal indicating unique reset noise of each pixel and the image signal indicating the intensity of incident light may be generically called a pixel signal as necessary.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. Thus, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the column driver 160 and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

The ISP 50 may perform image processing of image data received from the image sensing device 100. The ISP 50 may reduce noise of image data, and may perform various kinds of image signal processing (e.g., interpolation, synthesis, gamma correction, color filter array interpolation, color matrix, color correction, color enhancement, lens distortion correction, etc.) for image-quality improvement of the image data. In addition, the ISP 50 may compress image data that has been created by execution of image signal processing for image-quality improvement, such that the ISP 50 can create an image file using the compressed image data. Alternatively, the ISP 50 may recover image data from the image file. In this case, the scheme for compressing such image data may be a reversible format or an irreversible format. As a representative example of such compression format, in the case of using a still image, Joint Photographic Experts Group (JPEG) format, JPEG 2000 format, or the like can be used. In addition, in the case of using moving images, a plurality of frames can be compressed according to Moving Picture Experts Group (MPEG) standards such that moving image files can be created. For example, the image files may be created according to Exchangeable image file format (Exif) standards.

The ISP 50 may transmit the ISP image data to a host device (not shown). The host device (not shown) may be a processor (e.g., an application processor) for processing the ISP image data received from the ISP 50, a memory (e.g., a non-volatile memory) for storing the ISP image data, or a display device (e.g., a liquid crystal display (LCD)) for visually displaying the ISP image data.

In addition, the ISP 50 may transmit a control signal for controlling operations (e.g., whether or not to operate, an operation timing, an operation mode, etc.) of the image sensing device 100 to the image sensing device 100.

Figure 2:
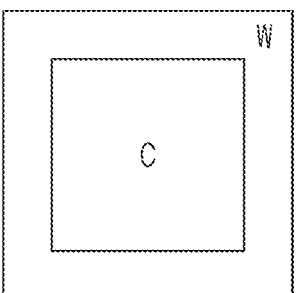
FIG. 2 is a schematic diagram illustrating an example of a pixel based on some implementations of the disclosed technology.

FIG. 2 is a schematic diagram illustrating an example of a pixel 200 based on some implementations of the disclosed technology.

Referring to FIG. 2, the pixel 200 may be any one of a plurality of pixels constituting the pixel array 110 of FIG. 1.

Each pixel constituting the pixel array 110 may include a first sub-pixel and a second sub-pixel, and FIG. 2 illustrates an embodiment in which the first sub-pixel is a color sub-pixel and the second sub-pixel is a white sub-pixel, and a detailed description thereof will hereinafter be given below with reference to FIG. 2.

The pixel 200 may include a color sub-pixel (C) serving as a first sub-pixel and a white sub-pixel (W) serving as a second sub-pixel. For example, the area of the first sub-pixel and the area of the second sub-pixel may be equal to each other. In another example, the area of the first sub-pixel may be larger or smaller than the area of the second sub-pixel. The amount of light received by the first sub-pixel and the amount of light received by the second sub-pixel may vary depending on the area of the first sub-pixel and the area of the second sub-pixel. Since the amounts of light received by the first sub-pixel and the second sub-pixel depend on the magnitude of the first sub-pixel and the magnitude of the second sub-pixel, when the first sub-pixel has a higher importance than the second sub-pixel, it may be preferable that the first sub-pixel be designed to have a larger area than the second sub-pixel.

The color sub-pixel (C) may be a pixel disposed at the center of the pixel 200 and may be shaped as a square or another suitable shape. The color sub-pixel (C) may include a color filter that transmits only incident light in a color corresponding to a predetermined wavelength band transmitted by the color filter (e.g., red, blue, or green). Thus, the color sub-pixel (C) is configured to receive and detect a portion of the incident light wavelength spectrum by the operation of the color filter in that color sub-pixel (C) without allowing light at other colors to be received and detected by the color sub-pixel (C). Accordingly, the color sub-pixel (C) may generate a pixel signal corresponding to the intensity of incident light having the corresponding color.

The white sub-pixel (W) may be a donut-shaped (or ring-shaped) pixel with an opening in the center and may be disposed between the color sub-pixels to separate adjacent color sub-pixels where a color sub-pixel is placed in the opening and is surrounded by the white sub-pixels in some implementations as shown in FIG. 2. In this example, the white sub-pixel (W) may be disposed at an edge of the pixel 200 or on the periphery of the color sub-pixel (C). In other words, the white sub-pixel (W) may be formed in a closed shape surrounding the color sub-pixel (C). The white sub-pixel (W) may not include a color filter so that all incident light at different wavelengths can be received without being filtered and the white sub-pixel (W) may generate a pixel signal corresponding to the intensity of incident light corresponding to the entire wavelength band of the received incident light.

Figure 3:
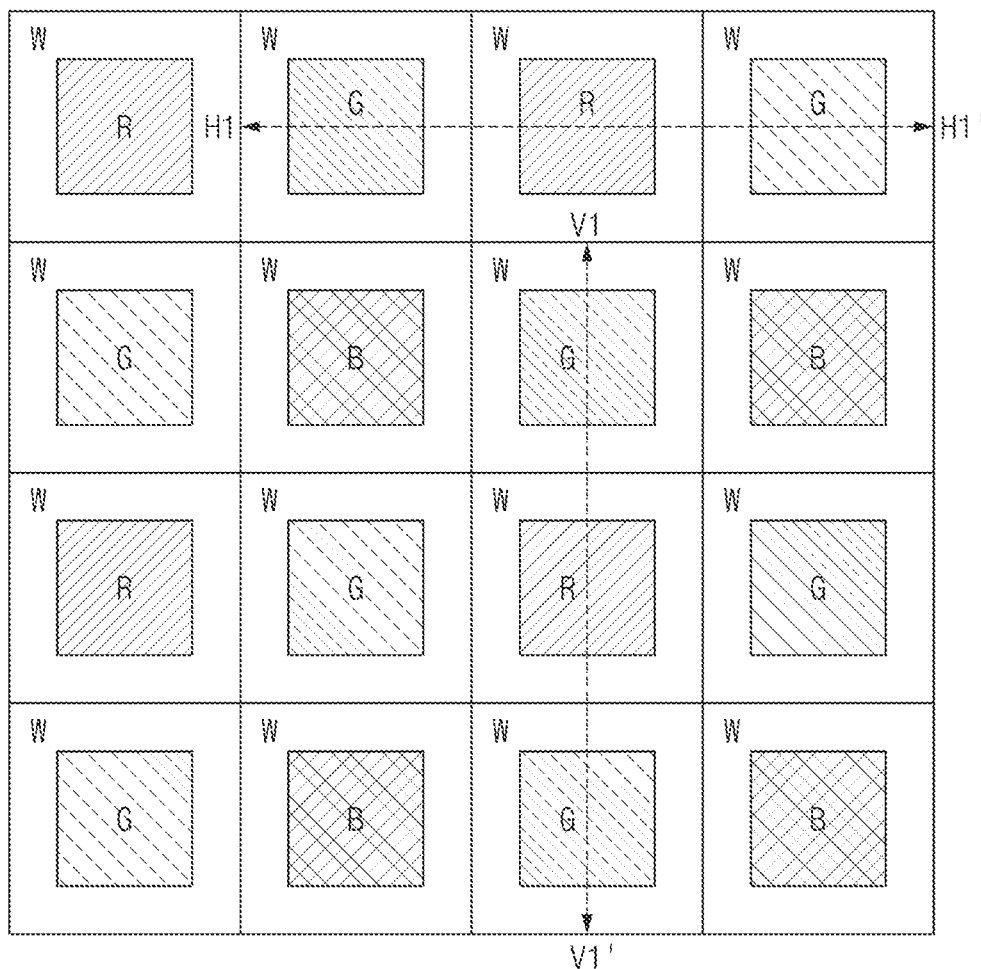
FIG. 3 is a schematic diagram illustrating an example of a portion of a pixel array including the pixels shown in FIG. 2 based on some implementations of the disclosed technology.

FIG. 3 is a schematic diagram illustrating an example of a portion 300 of a pixel array including the pixels shown in FIG. 2 based on some implementations of the disclosed technology.

Referring to FIG. 3, a portion 300 of a pixel array composed of pixels, each of which has a structure corresponding to the pixel 200 of FIG. 2 is illustrated. Each pixel may include a color sub-pixel (e.g., red pixel (R), blue pixel (B) or green pixel (G)) serving as a first sub-pixel, and a white sub-pixel (W) serving as a second sub-pixel. The red pixel (R) may be a pixel that generates a pixel signal by sensing red light. The blue pixel (B) may be a pixel that generates a pixel signal by sensing blue light. The green pixel (G) may be a pixel that generates a pixel signal by sensing green light.

The portion 300 of the pixel array may include 16 pixels arranged in a (4×4) matrix including four rows and four columns. A pattern of the pixels may be determined according to the type of color sub-pixels respectively included in the pixels.

In some implementations, 16 pixels may be arranged in a Bayer pattern. The Bayer pattern may refer to a pattern composed of pixels arranged in a (2×2) matrix shape in which the red pixel (R) and the blue pixel (B) are arranged in a diagonal direction and the remaining pixels other than the red and blue pixels of the (2×2) matrix are filled with the green pixels (G). Although the example embodiment in which pixels of the portion 300 of the pixel array are arranged in the Bayer pattern is discussed, other implementations are also possible. Thus, the pixels can be arranged in other manners without being limited to the Bayer pattern.

As shown in the portion 300 of the pixel array, the color sub-pixel R, G, or B may be disposed at the center of each pixel, and the white sub-pixel (W) may be arranged to surround each color sub-pixel R, G, or B at the edges of each pixel.

As the white sub-pixels (W) are arranged between the adjacent color sub-pixels (R, G, B), crosstalk among the color sub-pixels (R, G, B) can be significantly reduced, so that noise of color information generated from the color sub-pixels can also be reduced.

In some implementations, since each pixel includes the white sub-pixel (W), a resolution of the white sub-pixel (W) for each pixel can increase, which increases the accuracy of brightness (illuminance) information acquired from the white sub-pixel (W).

Figure 4:
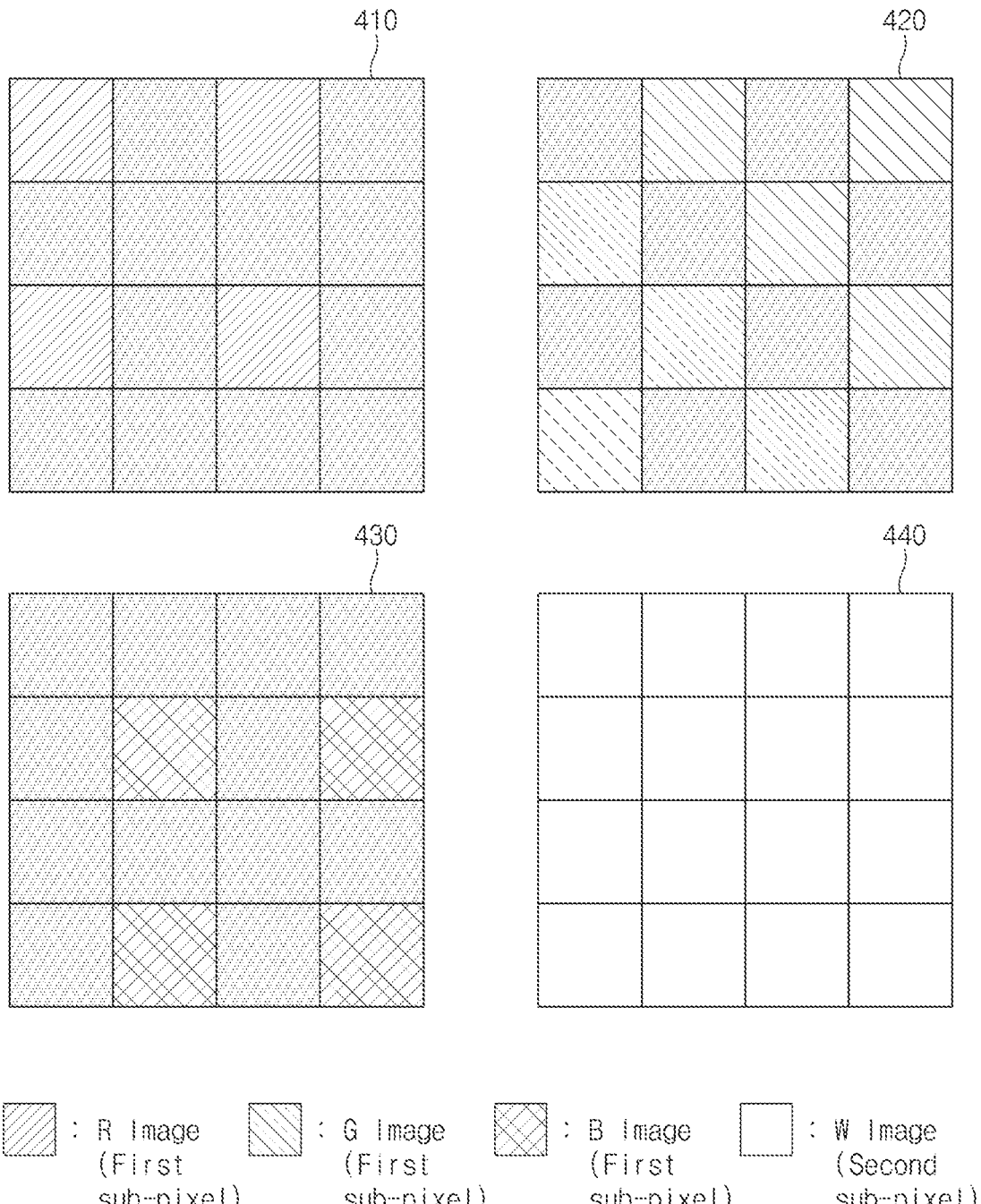
FIG. 4 is a schematic diagram illustrating an example of image data acquired from a portion of the pixel array shown in FIG. 3 based on some implementations of the disclosed technology.

FIG. 4 is a schematic diagram illustrating an example of image data acquired from the portion 300 of the pixel array shown in FIG. 3 based on some implementations of the disclosed technology.

Referring to FIG. 4, image data obtained from the portion 300 of the pixel array may include red image data 410, green image data 420, blue image data 430, and white image data 440. A shaded portion in each image data means that there is no corresponding image data. For example, the red image data 410 includes image data corresponding to four pixels, while the remaining shaded portions indicate no image data.

The red image data 410 may be image data generated based on the pixel signal of the red pixel (R), and the green image data 420 may be image data generated based on the pixel signal of the green pixel (G), the blue image data 430 may be image data generated based on the pixel signal of the blue pixel (B), and the white image data 440 may be image data generated based on the pixel signal of the white sub-pixel (W).

As can be seen from FIG. 4, white image data 440 and color image data corresponding to any one of the red image data 410, the green image data 420, and the blue image data 430 can be obtained from each of the pixels.

Unlike the above-described embodiment of the disclosed technology, in another embodiment, a pixel array is designed such that a white sub-pixel is not included in each pixel and one green pixel among color pixels arranged in the Bayer pattern is replaced with the white sub-pixel. In such pixel array according to another embodiment, the resolution of green image data may be deteriorated, and white image data can be obtained only from some pixels among all pixels included in the pixel array, thereby lowering the accuracy of brightness information for each pixel.

The ISP 50 may process color image data (e.g., any one of 410 to 430) for each pixel and white image data 440 for each pixel in various ways.

In accordance with one embodiment, the ISP 50 may allow an average value of color image data (e.g., any one of 410 to 430) for each pixel and white image data 440 for each pixel to be used as image data for each pixel. Here, the reason why the image data for each pixel is determined is that only one image data is required for each pixel in subsequent image processing (e.g., interpolation) and thus one image data needs to be determined using color image data and white image data that correspond to each pixel.

In accordance with another embodiment, the ISP 50 may calculate a first value that is obtained by adding a first correction value (e.g., a positive or negative number) to any one of three color image data 410 to 430 for each pixel, may calculate a second value that is obtained by dividing the white image data 440 by a second correction value (e.g., 2), may calculate the sum of the first value and the second value, and may thus use the calculated sum of the first and second values as image data for each pixel.

In accordance with another embodiment, the ISP 50 uses color image data (e.g., any one of 410 to 430) for each pixel as image data for each pixel without change, but uses the white image data 440 for other image processing operations (e.g., white balance correction and the like).

In accordance with still another embodiment, the ISP 50 may adaptively change the image processing method according to illuminance levels. For example, in a high-illuminance operating environment, the ISP 50 may use color image data (e.g., any one of 410 to 430) for each pixel as image data for each pixel without change. In a low-illuminance operating environment, the ISP may use a value obtained by the result of calculation between color image data (e.g., any one of 410 to 430) for each pixel and white image data 440 for each pixel as image data for each pixel.

This is because sufficient image information can be easily obtained only with color image data of color sub-pixel(s) smaller in size than the area of each pixel under the high-illuminance environment. It may be difficult to obtain sufficient image information only with color image data under the low-illuminance environment so that it is more preferable that white image data be additionally used to obtain such sufficient image information even in the low-illuminance environment. In some implementations, in order to prevent execution of an unnecessary operation, the ISP 50 may transmit, to the image sensing device 100, a control signal for preventing the white image data 440 from being generated in the high-illuminance environment.

For example, the ISP 50 may determine whether illuminance data indicates a high illuminance level or a low illuminance level based on detection data sensed by an illuminance sensor (not shown) embedded in the image sensing device 100. As another example, the ISP 50 may determine whether illuminance data indicates a high illuminance level or a low illuminance level based on an average (or sum) of the entire white image data 440 of the pixel array 110.

A method for processing color image data (e.g., any one of 410 to 430) and white image data 440 for each pixel by the ISP 50 described in this disclosure is merely an example, and an image processing method for typical RGBW data may also be used as needed.

Figure 5:
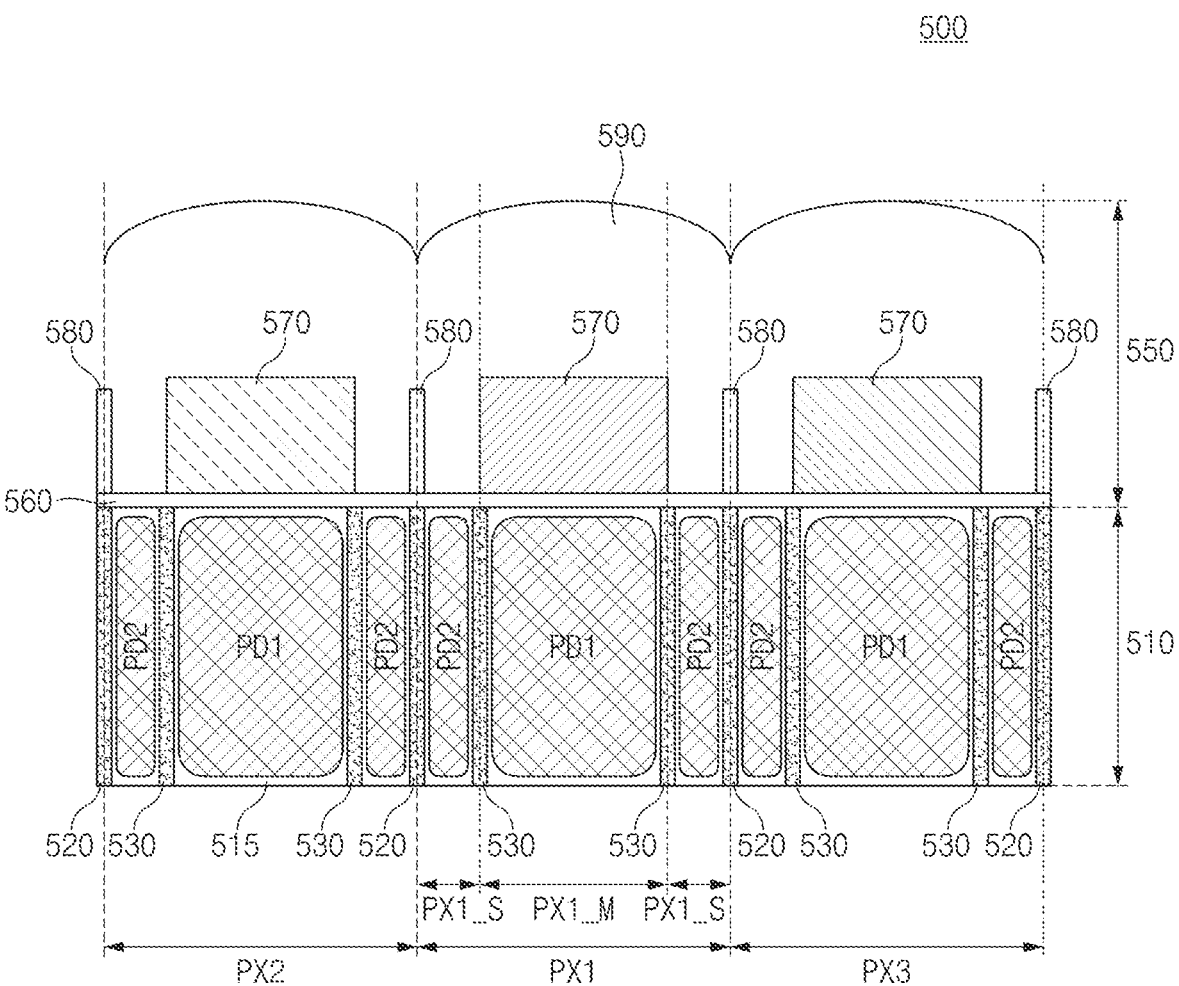
FIG. 5 is a cross-sectional view illustrating an example of the pixel array shown in FIG. 3 based on some implementations of the disclosed technology.

FIG. 5 is a cross-sectional view 500 illustrating an example of the pixel array shown in FIG. 3 based on some implementations of the disclosed technology.

Referring to FIG. 5, a cross-section view 500 of the portion 300 of the pixel array taken along the first horizontal cutting line H1-H1' or the first vertical cutting line V1-V1' is illustrated. For convenience of description, a pixel disposed at the center of the cross-section view 500 will hereinafter be referred to as a first pixel PX1, a pixel disposed at the left side of the first pixel PX1 will hereinafter be referred to as a second pixel PX2, and a pixel disposed at the right side of the first pixel PX1 will hereinafter be referred to as a third pixel PX3. For example, the first pixel PX1 may include a region (PX1_M) corresponding to the first sub-pixel and a region (PX1_S) corresponding to the second sub-pixel.

The cross-section view 500 may have a structure in which the substrate 510 and the light receiving structure (e.g., a light receiving layer 550) are vertically stacked. While the light receiving structure is described as the light receiving layer 550, other implementations are also possible without being limited to the layer.

The substrate 510 may include a top surface and a bottom surface facing the top surface. Thus, the top surface and the bottom surface oppose to each other. The bottom surface of the substrate 510 may be defined as a front side, and the top surface of the substrate 510 may be defined as a back side, without being limited thereto. For example, the substrate 510 may be a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate. The substrate 510 may include a silicon region 515.

The substrate 510 may include a first photoelectric conversion element PD1 and a second photoelectric conversion element PD2 physically isolated or separated from the first photoelectric conversion element PD1 by including a second device isolation structure 530 therebetween. In some implementations, the second device isolation structure 530 may correspond to a physical material or structure that is disposed between the first photoelectric conversion element PD1 and the second photoelectric conversion element PD2 to physically separate them without the direct contact therebetween. The first photoelectric conversion element PD1 may be included in each of the color sub-pixels (R, G, B) serving as the first sub-pixels, and may be disposed to have a preset area corresponding to each color sub-pixel R, G, or B. The second photoelectric conversion element PD2 may be included in the white sub-pixel (W) serving as the second sub-pixel, and may be disposed to have a preset area corresponding to the white sub-pixel (W).

Each of the first photoelectric conversion element PD1 and the second photoelectric conversion element PD2 may generate and accumulate photocharges in response to the intensity of incident light. Each of the first photoelectric conversion element PD1 and the second photoelectric conversion element PD2 may be formed as an N-type doped region by implanting N-type impurities into the substrate 510. In some implementations, each of the first photoelectric conversion element PD1 and the second photoelectric conversion element PD2 may be formed by stacking a plurality of doped regions having different doping concentrations. Here, the lower doped region may be formed by implanting $N^+$-type ions into the substrate 510, and the upper doped region may be formed by implanting N-type$^-$ ions into the substrate 510. Each of the first photoelectric conversion element PD1 and the second photoelectric conversion element PD2 may be arranged across as large a region as possible to increase a fill factor indicating light reception (Rx) efficiency.

A first device isolation structure 520 disposed in each of boundary regions of the first to third pixels PX1 to PX3 that are adjacent to each other may be formed. In the example, the first device isolation structure 520 may be formed by being deeply etched in a vertical direction perpendicular to the surface of the substrate 510. The first device isolation structure 520 can electrically or optically isolate the adjacent pixels PX1 to PX3 from each other.

A second device isolation structure 530 disposed in each of boundary regions between the white sub-pixel (W) and one of the color sub-pixels (R, G, B) of the first to third pixels PX1 to PX3 may be formed. In the example, the second device isolation structure 530 may be formed by being deeply etched in a vertical direction. The second device isolation structure 530 can electrically or optically isolate the first sub-pixel and the second sub-pixel from each other.

Each of the first device isolation structure 520 and the second device isolation structure 530 may include or be formed as a frontside deep trench isolation (FDTI) structure or a backside deep trench isolation (BDTI) structure. An insulation layer (e.g., a silicon oxide layer, a silicon nitride layer, or others) may be disposed in each of the first device isolation structure 520 and the second device isolation structure 530 for optical isolation. In some implementations, the insulation layer may include a polysilicon material to which a bias voltage for suppressing dark current can be applied for electrical isolation.

The width of the first device isolation structure 520 may be equal to or greater than the width of the second device isolation structure 530.

Photocharges accumulated in the first photoelectric conversion element PD1 may be converted into a pixel signal through a readout circuit connected to the first photoelectric conversion element PD1, and may transfer the pixel signal to the column line. Photocharges accumulated in the second photoelectric conversion element PD2 may be converted into a pixel signal through the readout circuit connected to the second photoelectric conversion element PD2, and may transfer the pixel signal to the column line. In some implementations, the readout circuit may include a transfer transistor, a floating diffusion (FD) node, a reset transistor, a source follower transistor, and a selection transistor.

The transfer transistor may transmit the photocharges accumulated in each of the first photoelectric conversion element PD1 and the second photoelectric conversion element PD2 to the floating diffusion (FD) node in response to a transmission (Tx) signal received from the row driver 120.

The floating diffusion (FD) node may include a region that receives photocharges from each of the first photoelectric conversion element PD1 and the second photoelectric conversion element PD2 and accumulates the received photocharges therein. The reset transistor may reset the floating diffusion (FD) node to a reset voltage (e.g., a power-supply voltage) in response to a pixel reset signal received from the row driver 120. The source follower transistor may convert a potential of the floating diffusion (FD) node connected to a gate electrode thereof into an electrical signal, and may output the electrical signal to the selection transistor. The selection transistor may transmit the electrical signal received from the source follower transistor to the column line in response to a row selection signal received from the row driver 120.

The transfer transistor of the readout circuit may be provided independently to correspond to each of the first photoelectric conversion element PD1 and the second photoelectric conversion element PD2, and the remaining elements of the readout circuit other than the transfer transistor may be commonly used for the first photoelectric conversion element PD1 and the second photoelectric conversion element PD2.

The light receiving layer 550 may receive incident light from the outside of the image sensing device 100, and may transmit the received incident light to the substrate 510. The light receiving layer 550 may include an anti-reflection layer 560, a plurality of optical filters 570, a plurality of optical grid structures 580, and a plurality of microlenses 590.

The anti-reflection layer 560 for reducing reflectivity of light incident upon the substrate 510 may be disposed over the microlens 590. The anti-reflection layer 560 may have a predetermined refractive index (e.g., a refractive index lower than that of the substrate 510) to reduce reflectivity.

The optical filter 570 may be disposed in the color sub-pixels (R, G, B) that correspond to the first sub-pixels of each of the pixels PX1 to PX3. The optical filter 570 may be disposed on the first photoelectric conversion element PD1 of the color sub-pixels (R, G, B). The optical filter 570 may be disposed between adjacent optical grid structures 580. The optical filters 570 may selectively transmit light with a specific color (e.g., red light, green light, blue light, magenta light, yellow light, cyan light, infrared (IR) light, or others) having a corresponding wavelength band. In this case, the wavelength band may refer to a wavelength band of light to be selectively transmitted by the corresponding optical filter. For example, each of the optical filters 570 may include a colored photosensitive material corresponding to a specific color, or may include thin film layers that are alternately arranged. For example, the optical filter 570 of the color sub-pixel (R) is configured to allow the red light to pass therethrough, the optical filter 570 of the color sub-pixel (G) is configured to allow the green light to pass therethrough, and the optical filter 570 of the color sub-pixel (B) is configured to allow the blue light to pass therethrough. The light which has passed through the corresponding optical filters 570 is transmitted to corresponding photoelectrical conversion elements of the color sub-pixels (R, G, B).

The optical filter 570 may not be disposed in the white sub-pixel (W) that corresponds to the second sub-pixel of each of the pixels PX1 to PX3. Since the optical filter 570 is not disposed over the second photoelectric conversion element PD2 of the white sub-pixel (W), light corresponding to the entire wavelength band can be transmitted to the second photoelectric conversion element PD2.

In some other implementations, an optical filter may also be disposed in the white sub-pixel (W) of each of the pixels PX1 to PX3. In this case, the transmission wavelength band of the optical filter disposed in the white sub-pixel (W) corresponds to the entire wavelength band of visible light, and thus light corresponding to the entire wavelength band may be transferred to the second photoelectric conversion element PD2. The optical filter disposed in the white sub-pixel (W) may be formed to have an area corresponding to the corresponding white sub-pixel (W) when viewed in a plane, and may also be formed to have a height corresponding to the optical filter 570 when viewed in a cross-section. The size of the optical filter as discussed above is one example only and other implementations are also possible without being limited thereto.

The optical grid structures 580 may be disposed along boundary regions between the adjacent pixels PX1 to PX3, and may prevent light incident upon the first to third pixels PX1 to PX3 from being introduced to adjacent pixels, thereby minimizing optical crosstalk between the adjacent pixels. In some other implementations, each of the optical grid structures 580 may be additionally disposed at a boundary between the first sub-pixel and the second sub-pixel of each of the first to third pixels PX1 to PX3, thereby minimizing optical crosstalk between the first sub-pixel and the second sub-pixel.

The microlenses 590 may be formed over the anti-reflection layer 560, the optical filters 570, and the optical grid structures 580, and may increase light gathering power of incident light, resulting in increased light reception (Rx) efficiency of the first photoelectric conversion element PD1 and the second photoelectric conversion element PD2.

Figure 6:
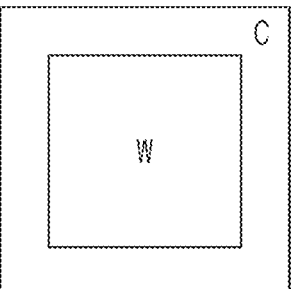
FIG. 6 is a schematic diagram illustrating an example of a pixel based on some other implementations of the disclosed technology.

FIG. 6 is a schematic diagram illustrating an example of a pixel 600 based on some other implementations of the disclosed technology.

Referring to FIG. 6, the pixel 600 may be any one of a plurality of pixels constituting the pixel array 110 of FIG. 1.

Each pixel constituting the pixel array 110 may include a first sub-pixel and a second sub-pixel, and FIG. 6 illustrates an embodiment in which the first sub-pixel is a white sub-pixel and the second sub-pixel is a color sub-pixel, and a detailed description thereof will hereinafter be provided below with reference to FIG. 6.

The pixel 600 may include a white sub-pixel (W) serving as a first sub-pixel and a color sub-pixel (C) serving as a second sub-pixel. For example, the area of the first sub-pixel and the area of the second sub-pixel may be equal to each other. In another example, the area of the first sub-pixel may be larger or smaller than the area of the second sub-pixel. The amount of light received by the first sub-pixel and the amount of light received by the second sub-pixel may vary depending on the area of the first sub-pixel and the area of the second sub-pixel. Since the amounts of light received by the first sub-pixel and the second sub-pixel depend on the magnitude of the first sub-pixel and the magnitude of the second sub-pixel, when the first sub-pixel has a higher importance than the second sub-pixel, it may be preferable that the first sub-pixel be designed to have a relatively larger area than the second sub-pixel.

The white sub-pixel (W) may be a square pixel disposed at the center of the pixel 600. The white sub-pixel (W) may not include a color filter, and thus the white sub-pixel (W) may generate a pixel signal corresponding to the intensity of incident light corresponding to the entire wavelength band.

The color sub-pixel (C) may be a donut-shaped (or ring-shaped) pixel disposed along the color sub-pixel. In some implementations, the color sub-pixel (C) may be disposed along the edge of the pixel 600. In some implementations, the color sub-pixel (C) may be disposed at the periphery of the white sub-pixel (W). In some implementations, the color sub-pixel (C) may be formed in a closed shape surrounding the white sub-pixel (W). The color sub-pixel (C) may include a color filter that transmits only incident light having a color (e.g., red, blue, or green) corresponding to a predetermined wavelength band. Thus, the color sub-pixel (C) is configured to allow the light having a color corresponding to a predetermined wavelength band to pass through corresponding filters. Accordingly, the color sub-pixel (C) may generate a pixel signal corresponding to the intensity of incident light having the corresponding color.

Figure 7:
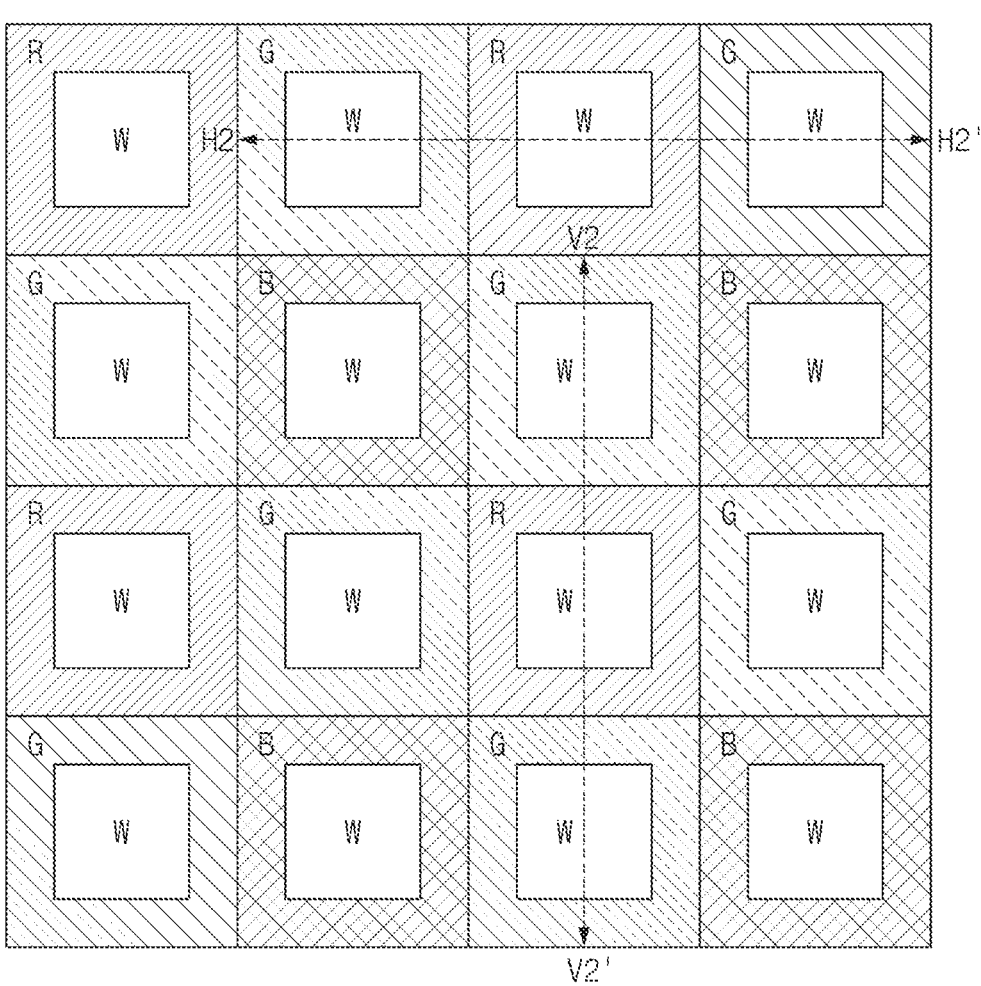
FIG. 7 is a schematic diagram illustrating an example of a portion of a pixel array including the pixel shown in FIG. 6 based on some implementations of the disclosed technology.

FIG. 7 is a schematic diagram illustrating an example of a portion 700 of a pixel array including the pixels shown in FIG. 6 based on some implementations of the disclosed technology.

Referring to FIG. 7, a portion 700 of a pixel array composed of pixels, each of which has a structure corresponding to the pixel 600 of FIG. 6 is illustrated. Each pixel may include a white sub-pixel (W) serving as a first sub-pixel and a color sub-pixel (e.g., red pixel (R), blue pixel (B) or green pixel (G)) serving as a second sub-pixel. The red pixel (R) may be a pixel that generates a pixel signal by sensing red light. The blue pixel (B) may be a pixel that generates a pixel signal by sensing blue light. The green pixel (G) may be a pixel that generates a pixel signal by sensing green light.

The portion 700 of the pixel array may include 16 pixels arranged in a (4×4) matrix including four rows and four columns. A pattern of the pixels may be determined according to the type of color sub-pixels respectively included in the pixels.

In some implementations, 16 pixels may be arranged in a Bayer pattern. The Bayer pattern may refer to a pattern composed of pixels arranged in a (2×2) matrix shape in which the red pixel (R) and the blue pixel (B) are arranged in a diagonal direction and the remaining pixels other than the red and blue pixels of the (2×2) matrix are filled with the green pixels (G). Although the example embodiment in which pixels of the portion 700 of the pixel array are arranged in the Bayer pattern is discussed, other implementations are also possible. Thus, the pixels can be arranged in other manners without being limited to the Bayer pattern.

As shown in the portion 700 of the pixel array, the white sub-pixel (W) may be disposed at the center of each pixel, and the color sub-pixel (R, G, B) may be arranged to surround the white sub-pixel (W) at the edges of each pixel.

As the color sub-pixels (R, G, B) are arranged between the adjacent white sub-pixels (W), crosstalk among the color sub-pixels (R, G, B) can be significantly reduced, so that noise of brightness (illuminance) information generated from the white sub-pixels (W) can also be reduced.

In some implementations, since each pixel includes the white sub-pixel (W), a resolution of the white sub-pixel (W) for each pixel is increased, which increases the accuracy of brightness (illuminance) information acquired from the white sub-pixel (W).

Figure 8:
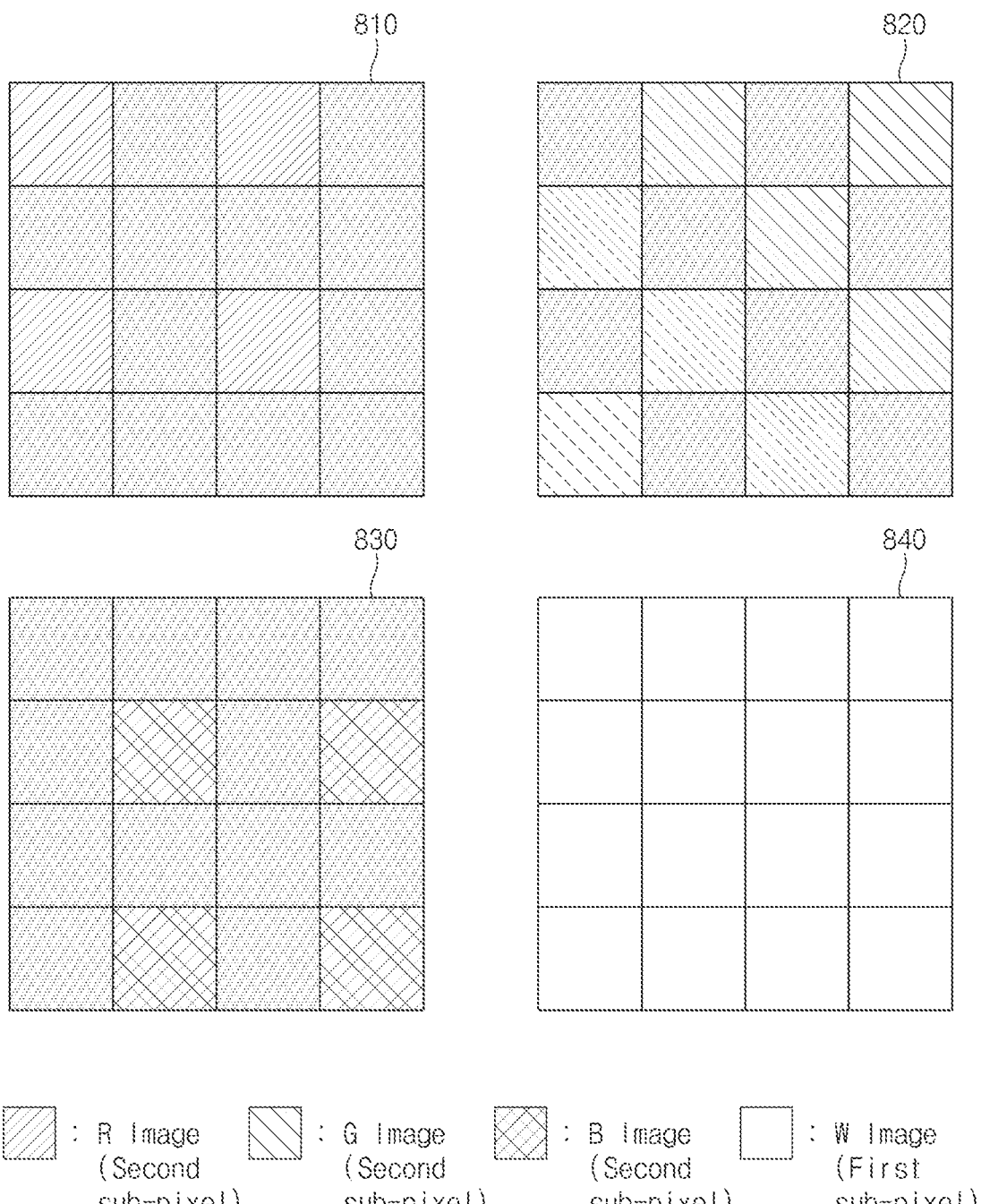
FIG. 8 is a schematic diagram illustrating an example of image data acquired from a portion of the pixel array shown in FIG. 7 based on some implementations of the disclosed technology.

FIG. 8 is a schematic diagram illustrating an example of image data acquired from the portion 700 of the pixel array shown in FIG. 7 based on some implementations of the disclosed technology.

Referring to FIG. 8, image data obtained from the portion 700 of the pixel array may include red image data 810, green image data 820, blue image data 830, and white image data 840. A shaded portion in each image data means that there is no corresponding image data. For example, the red image data 810 includes image data corresponding to four pixels, while the remaining shaded portions indicate no image data.

The red image data 810 may be image data generated based on the pixel signal of the red pixel (R), and the green image data 820 may be image data generated based on the pixel signal of the green pixel (G), the blue image data 830 may be image data generated based on the pixel signal of the blue pixel (B), and the white image data 840 may be image data generated based on the pixel signal of the white sub-pixel (W).

As can be seen from FIG. 8, white image data 840 and color image data corresponding to any one of the red image data 810, the green image data 820, and the blue image data 830 can be obtained from each of the pixels.

Unlike the above-described embodiment of the disclosed technology, in another embodiment, a pixel array is designed such that a white sub-pixel is not included in each pixel and one green pixel among color pixels arranged in the Bayer pattern is replaced with the white sub-pixel. In such pixel array according to another embodiment, the resolution of green image data may be deteriorated, and white image data can be obtained only from some pixels among all pixels included in the pixel array, thereby lowering the accuracy of brightness information for each pixel.

The ISP 50 may process color image data (e.g., any one of 810 to 830) for each pixel and white image data 840 for each pixel in various ways. A method for processing the color image data (e.g., any one of 810 to 830) and the white image data 840 by the ISP 50 is substantially the same as the method of FIG. 4, and as such a detailed description thereof will herein be omitted for brevity.

Figure 9:
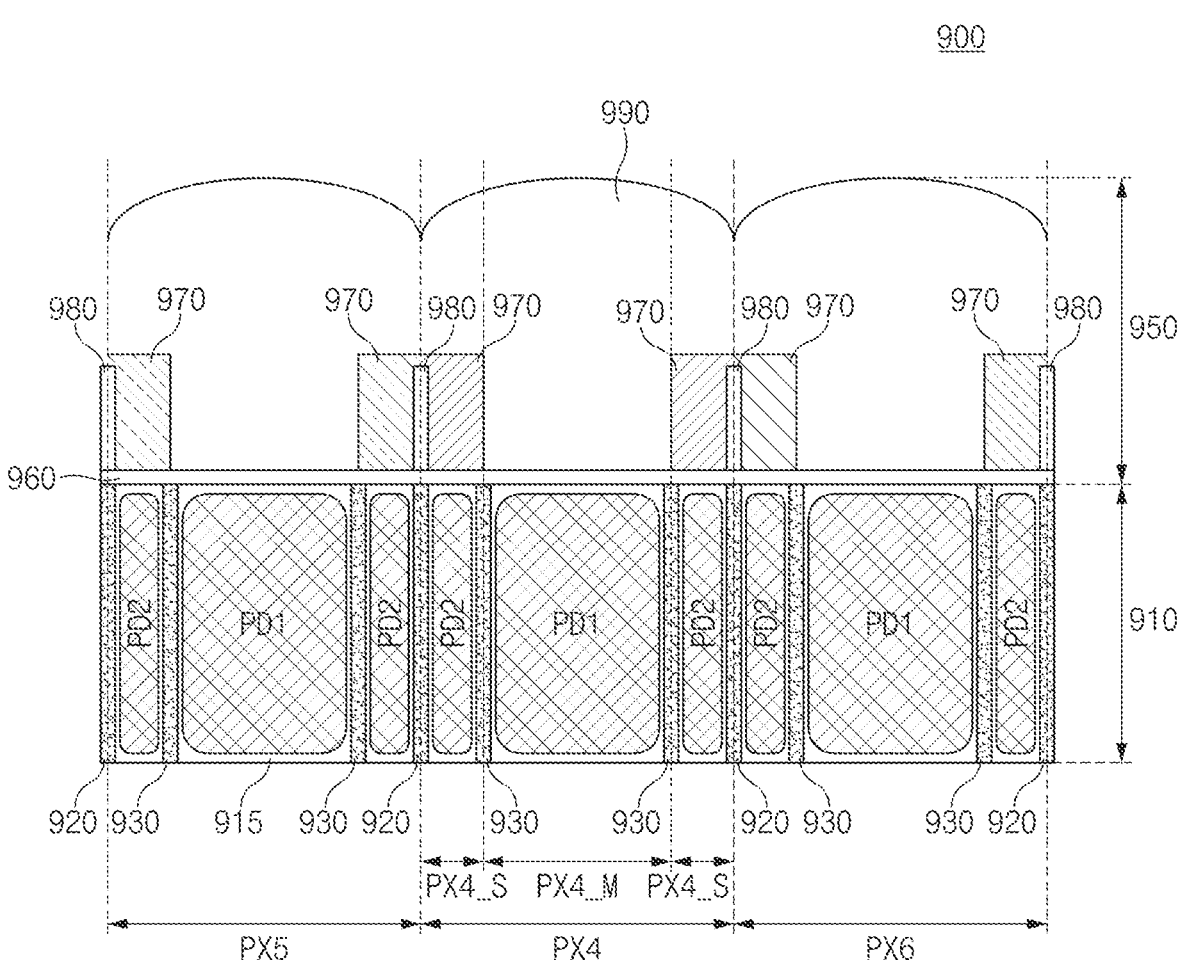
FIG. 9 is a cross-sectional view illustrating an example of the pixel array shown in FIG. 7 based on some implementations of the disclosed technology.

FIG. 9 is a cross-sectional view 900 illustrating an example of the pixel array shown in FIG. 7 based on some implementations of the disclosed technology.

Referring to FIG. 9, a cross-section 900 of the portion 700 of the pixel array taken along the second horizontal cutting line H2-H2' or the second vertical cutting line V2-V2' is illustrated. For convenience of description, a pixel disposed at the center of the cross-section 900 will hereinafter be referred to as a fourth pixel PX4, a pixel disposed at the left side of the fourth pixel PX4 will hereinafter be referred to as a fifth pixel PX5, and a pixel disposed at the right side of the fourth pixel PX4 will hereinafter be referred to as a sixth pixel PX6. For example, the fourth pixel PX4 may include a region (PX4_M) corresponding to the first sub-pixel and a region (PX4_S) corresponding to the second sub-pixel.

The cross-section 900 may have a structure in which the substrate 910 and the light receiving structure (e.g., a light receiving layer 950) are vertically stacked. While the light receiving structure is described as the light receiving layer 950, other implementations are also possible without being limited to the layer. The cross-section 900 of FIG. 9 is substantially the same as the cross-section view 500 of FIG. 5 except for some differences, as such redundant description thereof will herein be omitted for brevity, and the cross-section 900 of FIG. 9 will hereinafter be described centering upon characteristics different from those of FIG. 5.

The substrate 910 may include a first photoelectric conversion element PD1 and a second photoelectric conversion element PD2. The first photoelectric conversion element PD1 may be included in the white sub-pixel (W) serving as the first sub-pixel, and may be disposed to have a preset area corresponding to the white sub-pixel (W). The second photoelectric conversion element PD2 may be included in each of the color sub-pixels (R, G, B) serving as second sub-pixels, and may be disposed to have a preset area corresponding to the color sub-pixels (R, G, B).

The substrate 910 may further include a silicon region 915, a first device isolation structure 920, and a second device isolation structure 930, and the silicon region 915 and the first and second device isolation structures 920 and 930 shown in FIG. 8 may be substantially identical in structure and function to the silicon region 515 and the first and second device isolation structures 520 and 530 shown in FIG. 5.

The light receiving layer 950 may include at least one optical filter 970, and each of the optical filters 970 may be disposed in each of the color sub-pixels (R, G, B) serving as the second sub-pixels of the pixels PX4 to PX6. Each of the optical filters 970 may be disposed over the second photoelectric conversion element PD2 of each of the color sub-pixels (R, G, B). The optical filter 970 may be disposed between the optical grid structures 980 adjacent to each other, and may selectively transmit light with a specific color having a transmission wavelength band.

The optical filter 970 may not be disposed in the white sub-pixel (W) serving as the first sub-pixel of each of the pixels PX4 to PX6. Since the optical filter 970 is not disposed over the first photoelectric conversion element PD1 of the white sub-pixel (W), light corresponding to the entire wavelength band can be transferred to the first photoelectric conversion element PD1.

In some other implementations, an optical filter may also be disposed in the white sub-pixel (W) of each of the pixels PX1 to PX3. In this case, the transmission wavelength band of the optical filter disposed in the white sub-pixel (W) corresponds to the entire wavelength band of visible light, and thus light corresponding to the entire wavelength band may be transferred to the second photoelectric conversion element PD2.

The optical filter disposed in the white sub-pixel (W) may be formed to have an area corresponding to the corresponding white sub-pixel (W) when viewed in a plane, and may also be formed to have a height corresponding to the optical filter 970 when viewed in a cross-section. The size of the optical filter as discussed above is one example only and other implementations are also possible without being limited thereto.

The light receiving layer 950 may further include optical grid structures 980 and microlenses 990, and the optical grid structures 980 and the microlenses 990 of FIG. 9 are substantially identical in structure and function to the optical grid structures 580 and the microlenses 590 of FIG. 5.

As is apparent from the above description, the image sensing device 100 based on some implementations of the disclosed technology may include a color sub-pixel and a white sub-pixel in one pixel so that color information and brightness information for each pixel can be obtained together, resulting in a higher quality of images.

The embodiments of the disclosed technology may provide a variety of effects capable of being directly or indirectly recognized through the above-mentioned patent document.

Although a number of illustrative embodiments have been described, it should be understood that modifications and enhancements to the disclosed embodiments and other embodiments can be devised based on what is described and/or illustrated in this patent document.

What is claimed is:

1. An image sensing device comprising:
a plurality of pixels, each pixel configured to respond to incident light to produce photocharges corresponding to the incident light and include a first sub-pixel and a second sub-pixel surrounding the first sub-pixel,

16 wherein
the first sub-pixel is one of a color sub-pixel configured to selectively sense first color light within the incident light and a white sub-pixel configured to sense the incident light at different colors;
the second sub-pixel is the other of the color sub-pixel and the white sub-pixel;
the first sub-pixel is the color sub-pixel; and
the second sub-pixel is the white sub-pixel.

2. The image sensing device according to claim 1, wherein:
the first sub-pixel is disposed at a center of each pixel;
the second sub-pixel is arranged to include a shape that surrounds the first sub-pixel.

3. The image sensing device according to claim 1, wherein:
the first sub-pixel is configured to have a larger area than an area of the second sub-pixel.

4. The image sensing device according to claim 1, wherein:
the first sub-pixel includes an optical filter configured to allow the first color light to pass through the optical filter; and
the second sub-pixel is free of the optical filter.

5. The image sensing device according to claim 1, wherein:
the first sub-pixel includes a first photoelectric conversion element configured to convert any one of the first color light and white light into the photocharges; and
the second sub-pixel includes a second photoelectric conversion element configured to convert the other of the first color light and the white light into the photocharges,
wherein
the first photoelectric conversion element and the second photoelectric conversion element are physically separated from each other.

6. The image sensing device according to claim 1, further comprising:
a first device isolation structure configured to optically isolate a second sub-pixel of a first pixel from a second sub-pixel of a second pixel adjacent to the first pixel.

7. The image sensing device according to claim 1, further comprising:
a second device isolation structure configured to optically isolate the first sub-pixel from the second sub-pixel.

8. An imaging device comprising:
an image sensing device comprising a plurality of pixels, each pixel configured to respond to incident light to produce photocharges corresponding to the incident light and include a first sub-pixel and a second sub-pixel surrounding the first sub-pixel, wherein the first sub-pixel is one of a color sub-pixel configured to selectively sense first color light within the incident light and a white sub-pixel configured to sense the incident light at different colors; and the second sub-pixel is the other of the color sub-pixel and the white sub-pixel; and
an image signal processor communicatively coupled to the plurality of pixels and configured to process image data generated from each of the first sub-pixel and the second sub-pixel,
wherein the image signal processor is configured to:
determine data indicating a result of calculation between first image data generated from the first sub-pixel and second image data generated from the second sub-pixel to be image data of each pixel including the first sub-pixel and the second sub-pixel.

9. The imaging device according to claim 8, wherein:

the first sub-pixel is disposed at a center of each pixel;

the second sub-pixel is arranged to include a shape that surrounds the first sub-pixel.

10. The imaging device according to claim 8, wherein:

the first sub-pixel is configured to have a larger area than an area of the second sub-pixel.

11. The imaging device according to claim 8, wherein:

the first sub-pixel includes an optical filter configured to allow the first color light to pass through the optical filter; and the second sub-pixel is free of the optical filter.

12. An imaging device comprising:

a pixel array including pixels that are arranged in rows and columns, wherein each pixel includes:

a first sub-pixel including a first photoelectric conversion element disposed in a substrate and configured to produce an electrical signal in response to first light incident to the first photoelectric conversion element; and a second sub-pixel including a second photoelectric conversion element disposed in the substrate and configured to produce a second electrical signal in response to second light incident to the second photoelectric conversion element, wherein one of the first sub-pixel and the second sub-pixel is a white sub-pixel configured to transmit incident light to a corresponding photoelectric conversion element without optically filtering the incident light, and wherein:

the first sub-pixel is disposed at a center of each pixel;

the second sub-pixel is arranged to surround the first sub-pixel; and the first sub-pixel is configured to have a larger area than an area of the second sub-pixel.

13. The imaging device according to claim 12, wherein:

the first sub-pixel is a color sub-pixel that selects light of a first color within the incident light at different colors as the first light to transmit to the first photoelectric conversion element; and the second sub-pixel is the white sub-pixel so that the second light to transmit to the second photoelectric conversion element contains light of different colors in the incident light.

14. The imaging device according to claim 12, wherein:

the first sub-pixel is the white sub-pixel so that the first light to transmit to the first photoelectric conversion element contains light of different colors in the incident light; and the second sub-pixel is a color sub-pixel that selects light of a first color within the incident light at different colors as the second light to transmit to the second photoelectric conversion element.

15. The imaging device according to claim 12, further comprising: an image signal processor communicatively coupled to the pixel array and configured to process image data generated from each of the first sub-pixel and the second sub-pixel.

16. The imaging device according to claim 15, wherein the image signal processor is further configured to:

determine image data of each pixel based on data indicating a result of calculation based on first image data generated from the first sub-pixel and second image data generated from the second sub-pixel.

17. The imaging device according to claim 15, wherein the image signal processor is further configured to:

determine image data of each pixel to correspond to color image data from either the first sub-pixel or the second sub-pixel.

* * * * *